(12) United States Patent
Kao et al.

(10) Patent No.: US 10,885,833 B2
(45) Date of Patent: Jan. 5, 2021

(54) DEVICE FOR SHOWING A PROJECTION PATTERN

(71) Applicant: PRIMAX ELECTRONICS LTD., Taipei (TW)

(72) Inventors: Han-Pin Kao, Taipei (TW); Wei-Chiang Huang, Taipei (TW); Wei-Ping Chan, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 0 days.

(21) Appl. No.: 16/518,497

(22) Filed: Jul. 22, 2019

(65) Prior Publication Data
US 2020/0126474 A1 Apr. 23, 2020

Related U.S. Application Data
(60) Provisional application No. 62/747,868, filed on Oct. 19, 2018.

(51) Int. Cl.
| G09G 3/34 | (2006.01) |
| G09G 3/32 | (2016.01) |
| H01L 27/32 | (2006.01) |
| H04N 5/74 | (2006.01) |

(52) U.S. Cl.
CPC ............ *G09G 3/32* (2013.01); *H01L 27/3211* (2013.01); *H04N 5/74* (2013.01)

(58) Field of Classification Search
CPC ......... G09G 3/32; H01L 27/3211; H04N 5/74

USPC .......................................................... 345/76
See application file for complete search history.

(56) References Cited

U.S. PATENT DOCUMENTS

| 5,443,869 A | * | 8/1995 | Harris | ............... B32B 17/10018 40/594 |
| 2006/0050380 A1 | * | 3/2006 | Yoon | ..................... G03B 21/625 359/460 |
| 2012/0287381 A1 | * | 11/2012 | Li | ...................... G02F 1/133617 349/106 |
| 2014/0022390 A1 | * | 1/2014 | Blank | ....................... B60R 1/12 348/148 |
| 2014/0370980 A1 | * | 12/2014 | Czyzewski | ........... G07F 17/322 463/31 |
| 2015/0048361 A1 | * | 2/2015 | Yamakita | ............ H01L 29/7869 257/43 |
| 2016/0373110 A1 | * | 12/2016 | Koehne | .............. H03K 17/9622 |

* cited by examiner

*Primary Examiner* — Jonathan M Blancha
(74) *Attorney, Agent, or Firm* — Kirton McConkie; Evan R. Witt

(57) ABSTRACT

A display device is disposed within a casing of an electronic device. The display device includes a display part, at least one light source, a projection part and an imaging structure. The display part is disposed on the casing and exposed outside. The at least one light source is disposed within the casing, and emits at least one light beam. The projection part is arranged between the at least one light source and the display part, and has an image region. After the at least one light beam passes through the projection part, a projection pattern corresponding to the image region is generated. The imaging structure is disposed on the display part. The imaging structure receives the projection pattern, so that the projection pattern is shown on the display part.

10 Claims, 5 Drawing Sheets

DEVICE FOR SHOWING A PROJECTION PATTERN

CROSS-REFERENCE TO RELATED APPLICATION

This application claims the benefit of U.S. Provisional Patent Application No. 62/747,868 filed Oct. 19, 2018, the contents of which are incorporated herein by reference.

FIELD OF THE INVENTION

The present invention relates to a display device, and more particularly to a display device for showing a specified projection pattern.

BACKGROUND OF THE INVENTION

Generally, the casings of various products are equipped with brand images in order to provide brand recognition. In the field of an electronic device, an electronic circuit is disposed within the electronic device. In case that the brand image on the casing of the electronic device is electrically connected with the electronic circuit, the brand image is illuminated to provide a more conspicuous visual effect.

For illuminating the brand image, a display device is installed within the electronic device. FIG. 1 is a schematic side view illustrating a conventional display device. The conventional display device 1 is disposed within a casing 10 of an electronic device. The conventional display device 1 comprises a light emitting diode 11, a display part 12 and a driving circuit module (not shown). When the light emitting diode 11 is enabled, the light emitting diode 11 emits a light beam B. The display part 12 is disposed on the casing 10 and exposed outside. The display part 12 comprises a laser engraving structure 121. A brand image to be displayed is aligned with the laser engraving structure 121. The driving circuit module is electrically connected with the light emitting diode 11 and the internal circuit of the electronic device. The driving circuit module acquires electric power from the electronic device in order to drive the light emitting diode 11.

When the light emitting diode 11 is driven to emit the light beam B, the light beam B is projected to the display part 12. Consequently, the traveling direction of the light beam B is changed by the laser engraving structure 121, and the corresponding brand image is shown on the display part 12. Consequently, the illuminated brand image can be shown on the casing 10 of the electronic device. When the user in a first position X views the electronic device at the viewing angle of zero degree, the use can clearly view the brand image. However, the user also views the light emitting diode 11 behind the brand image. When the user in a second position Y views the electronic device at the larger viewing angle, the viewed brand image is suffered from distortion. Under this circumstance, it is difficult to recognize the brand image.

In other words, the conventional display device needs to be further improved.

SUMMARY OF THE INVENTION

An object of the present invention provides a display device for a small-sized electronic device. The projection pattern can be clearly shown at various viewing angles.

In accordance with an aspect of the present invention, a display device is provided. The display device is disposed within a casing of an electronic device. The display device includes a display part, at least one light source, a projection part and an imaging structure. The display part is disposed on the casing and exposed outside. The at least one light source is disposed within the casing, and emits at least one light beam. The projection part is arranged between the at least one light source and the display part, and has an image region. After the at least one light beam passes through the projection part, a projection pattern corresponding to the image region is generated. The imaging structure is disposed on the display part. The imaging structure receives the projection pattern, so that the projection pattern is shown on the display part.

In accordance with another aspect of the present invention, a display device is provided. The display device is disposed within a casing of an electronic device. The display device includes a display part, at least one light source and an ink structure. The display part is disposed on the casing and exposed outside. The at least one light source is disposed within the casing, and emits at least one light beam. The ink structure is disposed on the display part, and has an image region. After the at least one light beam passes through the ink structure, the image region is projected and a projection pattern corresponding to the image region is generated, so that the projection pattern is shown on the display part.

In accordance with a further aspect of the present invention, a display device is provided. The display device is disposed within a casing of an electronic device. The display device includes a display part, a first light source, a second light source, a first projection part, a second projection part and an imaging structure. The display part is disposed on the casing and exposed outside. The first light source is disposed within the casing, and emits a first light beam. The second light source is disposed within the casing, and emits a second light beam. The first projection part is arranged between the first light source and the display part, and has a first image region. After the first light beam passes through the first projection part, a first projection pattern corresponding to the first image region is generated. The second projection part is arranged between the second light source and the display part, and has a second image region. After the second light beam passes through the second projection part, a second projection pattern corresponding to the second image region is generated. The imaging structure is disposed on the display part. The imaging structure receives the first projection pattern and the second projection pattern, so that a complete projection pattern containing the first projection pattern and the second projection pattern is shown on the display part.

From the above descriptions, the display device of the present invention comprises the projection part, the imaging structure, the display part and the protective layer. The projection part has the image region. Due to the arrangement of the imaging structure, the image region is projected to the display part. Alternatively, the image region is projected to the display part through the ink structure. Consequently, the user can view the complete and non-distorted image region at any viewing angle. Moreover, due to the opaque portion of the projection part, the imaging structure or the protective layer, the light source within the casing is hindered by these components and the light source is not visible from the outside. In some embodiments, the light source is a dot light source. Due to the projection part with the image region or the ink structure, the projection pattern can be projected to the non-flat display part, for example the display part with a curvy surface. Consequently, the display device of the present invention can overcome the drawbacks of the conventional technologies.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

Figure 1:
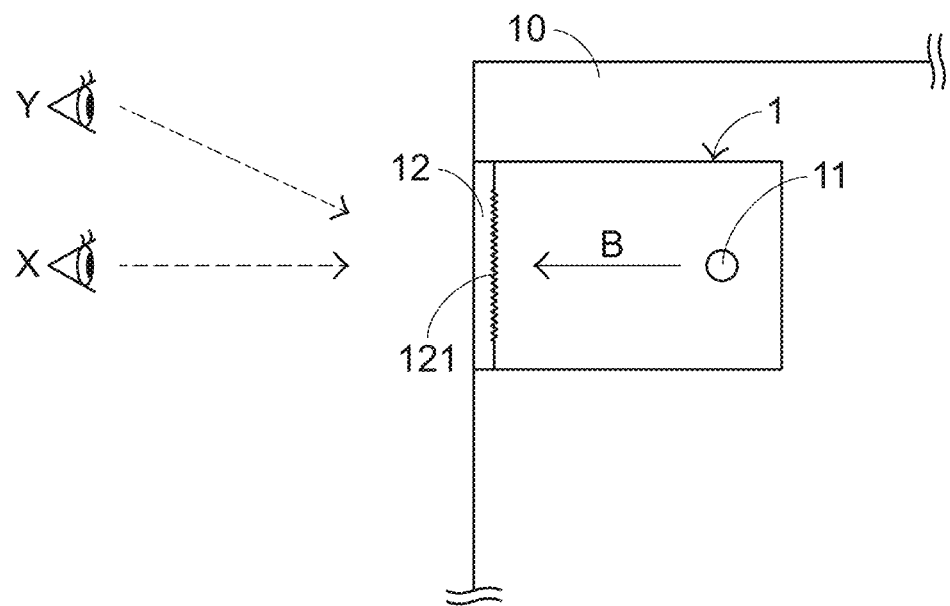
FIG. 1 is a schematic side view illustrating a conventional display device.

For overcoming the drawbacks of the conventional technologies, the present invention provides a display device. The embodiments of present invention will be described more specifically with reference to the following drawings. For well understanding the present invention, the elements shown in the drawings are not in scale with the elements of the practical product. In the following embodiments and drawings, the elements irrelevant to the concepts of the present invention or the elements well known to those skilled in the art are omitted. It is noted that numerous modifications and alterations may be made while retaining the teachings of the invention.

Figure 2:
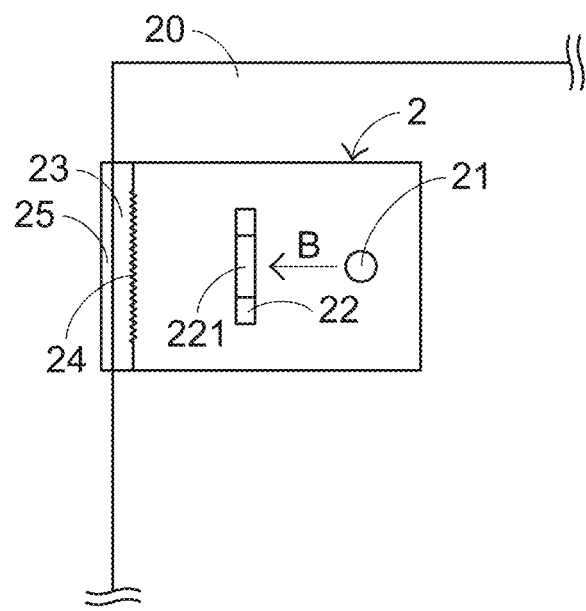
FIG. 2 is a schematic side view illustrating the structure of a display device according to a first embodiment of the present invention.

FIG. 2 is a schematic side view illustrating the structure of a display device according to a first embodiment of the present invention. The display device 2 is disposed within a casing 20 of an electronic device. In this embodiment, the display device 2 comprises a light source 21, a projection part 22, a display part 23, an imaging structure 24, a protective layer 25 and a driving circuit module (not shown).

When the light source 21 is enabled, the light sources 21 emit a light beam B. The display part 23 is disposed on the casing 20 and exposed outside. For example, the light source 21 is any kind of light emitting diode (LED), e.g., a micro LED. The display part 23 is made of a light-transmissible material such as ABS resin.

The projection part 22 is arranged between the light source 21 and the display part 23. The projection part 22 has an image region 221. The region of the projection part 22 excluding the image region 221 is opaque. After the light beam B passes through the image region 221 of the projection part 22, a projection pattern (not shown) corresponding to the image region 221 is generated. In an embodiment, the projection part 22 is a photographic film. The image region 221 of the projection part 22 indicates the information to be displayed according to the practical requirements. The image region 221 is formed on the projection part 22 through a printing process or a developing process. The way of forming the image region 221 is well known to those skilled in the art, and is not redundantly described herein.

The imaging structure 24 is formed on the display part 23 by an optical machining process. Due to the imaging structure 24, the traveling direction of the light beam B in the display part 23 is changed. After the light beam B passes through the image region 221 of the projection part 22 and the projection pattern is generated, the display part 23 receives the projection pattern. That is, the projection pattern is shown on the display part 23. In an embodiment, the imaging structure 24 is formed on an inner surface of the display part 23. The optical machining process is a sandblasting process, a printing process, a texturing process, a dying process, a coating process or any other appropriate machining process. In another embodiment, the imaging structure is formed on the inner surface of the display part or formed within the display part. Especially, the imaging structure is formed within the display part by the dying process. For example, the imaging structure contains phosphor agent or light diffusion agent. The phosphor agent or light diffusion agent is added to the inner portion of the display part by the dying process during the process of forming the display part.

The protective layer 25 is used for covering the display part 23. Consequently, the display part 23 is protected from being damaged by the external force. The arrangement of the driving circuit module is similar to that of the conventional technology, and is not redundantly described herein. In an embodiment, the protective layer 25 is formed on the display part 23 by a coating process.

After the above components are assembled, the display device 2 is fabricated. When the power source 21 is driven by the driving circuit module, the power source 21 emits the light beam B. The light beam B is projected to the projection part 22 and transmitted through the image region 221 of the projection part 22. After the light beam B is transmitted through the image region 221 of the projection part 22, the projection pattern is generated in a projecting manner. Consequently, the user can view the complete and non-distorted image region 221 at any viewing angle. Moreover, due to the arrangement of the projection part 22, the imaging structure 24 and/or the protective layer 25, the light source 21 is not visible from the outside. In other words, the light source 21 within the display device 2 is not viewed by the user from the outside of the electronic device.

Figure 3:
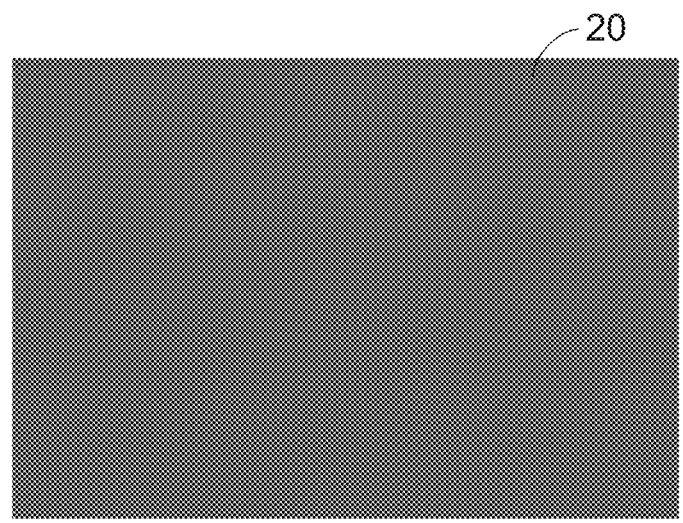
FIG. 3 schematically illustrates the casing of the display device according to the first embodiment of the present invention, in which the projection pattern is not shown.
Figure 4:
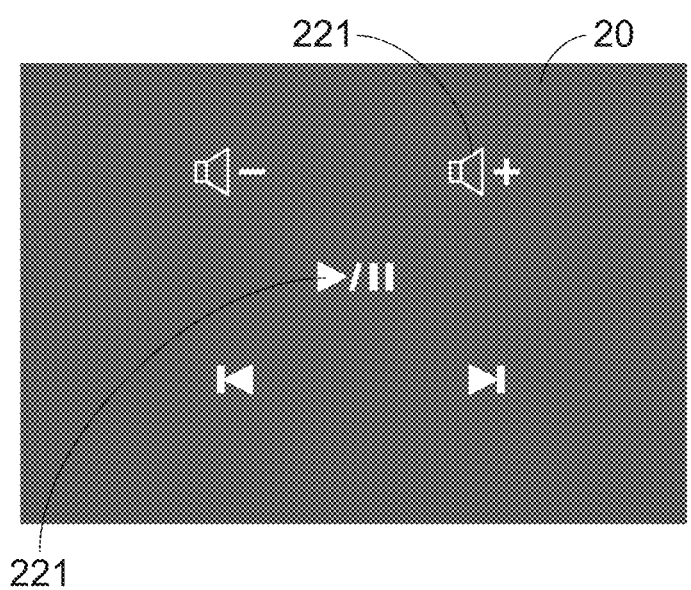
FIG. 4 schematically illustrates the casing of the display device according to the first embodiment of the present invention, in which the projection pattern is shown.

Please refer to FIG. 3. When the light source 21 of the display device 2 is not enabled, the smooth and flat surface of the casing 20 is shown. Please refer to FIG. 4. After the light source 21 is enabled, the projection pattern corresponding to the image region 221 is clearly shown on the casing 20.

Figure 5:
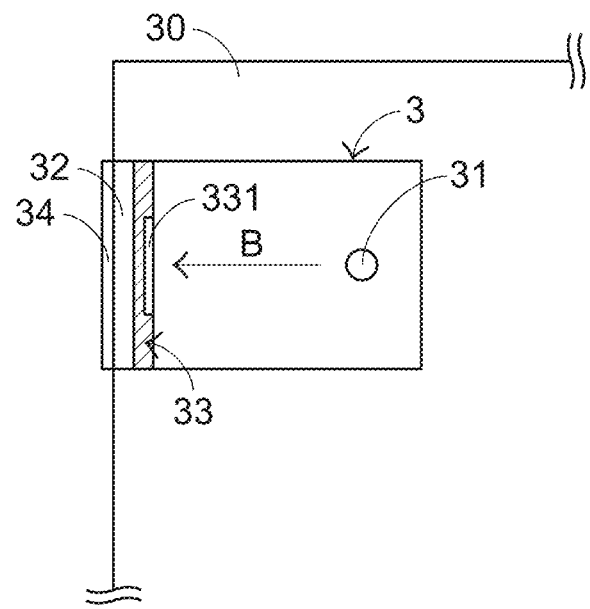
FIG. 5 is a schematic side view illustrating the structure of a display device according to a second embodiment of the present invention.

The present invention further provides a second embodiment. FIG. 5 is a schematic side view illustrating the structure of a display device according to a second embodiment of the present invention. The display device 3 is disposed within a casing 30 of an electronic device. In this embodiment, the display device 3 comprises a light source 31, a display part 32, an ink structure 33, a protective layer 34 and a driving circuit module (not shown). The structures of the components of the display device 3 which are identical to those of the first embodiment are not redundantly described herein. In comparison with the first embodiment, the display device 3 of this embodiment is equipped with the ink structure 33, and the projection part 22 and the imaging structure 24 are omitted.

The ink structure 33 is formed on an inner surface or an outer surface of the display part 32 by a printing process. The ink structure 33 has an image region 331. When the light beam B is projected to the ink structure 33, the image region 331 is projected and a projection pattern (not shown) corresponding image region 331 is generated because of the arrangement of the image region 331 and the characteristics of the ink structure 33. Consequently, the projection pattern is shown on the display part 32. In an embodiment, the ink structure 33 is made of photoluminescence ink. When the ink structure 33 receives the light beam B, a luminous effect is generated. Consequently, it is not necessary to install the projection part in the display device 3.

Figure 6:
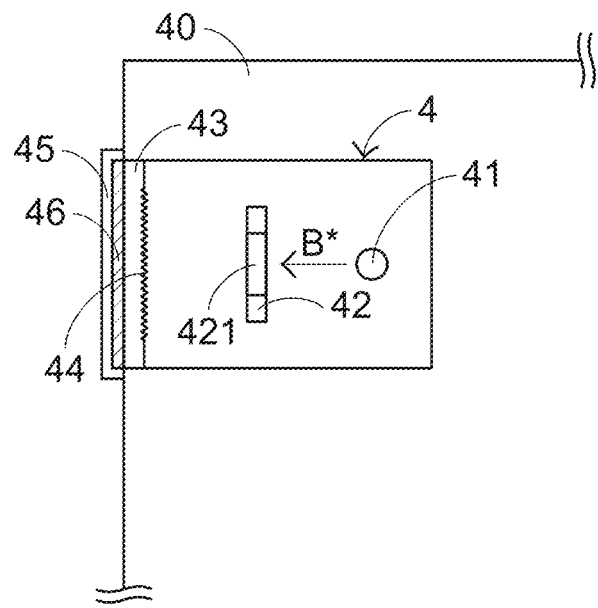
FIG. 6 is a schematic side view illustrating the structure of a display device according to a third embodiment of the present invention.

The present invention further provides a third embodiment. FIG. 6 is a schematic side view illustrating the structure of a display device according to a third embodiment of the present invention. The display device 4 is disposed within a casing 40 of an electronic device. In this embodiment, the display device 4 comprises a light source 41, a projection part 42, a display part 43, an imaging structure 44, a protective layer 45, a driving circuit module (not shown) and an ink structure 46. The projection part 42 has an image region 421. The structures of the components of the display device 4 which are identical to those of the first embodiment are not redundantly described herein. In comparison with the first embodiment, the display device 4 of this embodiment is additionally equipped with the ink structure 46 and the type of the light source 41 is distinguished. The ink structure 46 is formed on the outer surface of the display part 43 by a printing process. The ink structure 46 is made of invisible photoluminescence ink. The protective layer 45 is used for covering the ink structure 46. Consequently, the ink structure 46 and the display part 43 are protected by the protective layer 45. The light source 41 is an invisible light emitting diode.

When the light source 41 is enabled by the driving circuit module, the light sources 41 emit an invisible light beam B*. The invisible light beam B* is projected to the projection part 42. After the light beam B* passes through the image region 421 of the projection part 42, the image region 421 can be projected on the display part 43 because of the arrangement of the imaging structure 44. That is, a projection pattern (not shown) corresponding to the image region 421 is projected on the display part 43. Since the projection pattern has the luminous effect corresponding to the invisible light beam, the projection pattern cannot be viewed by the user's eyes. In this embodiment, the ink structure 46 on the display part 43 receives the projection pattern with the luminous effect. Since the ink structure 46 generates the luminous effect, the illuminated projection pattern can be shown on the display part 43.

Figure 7:
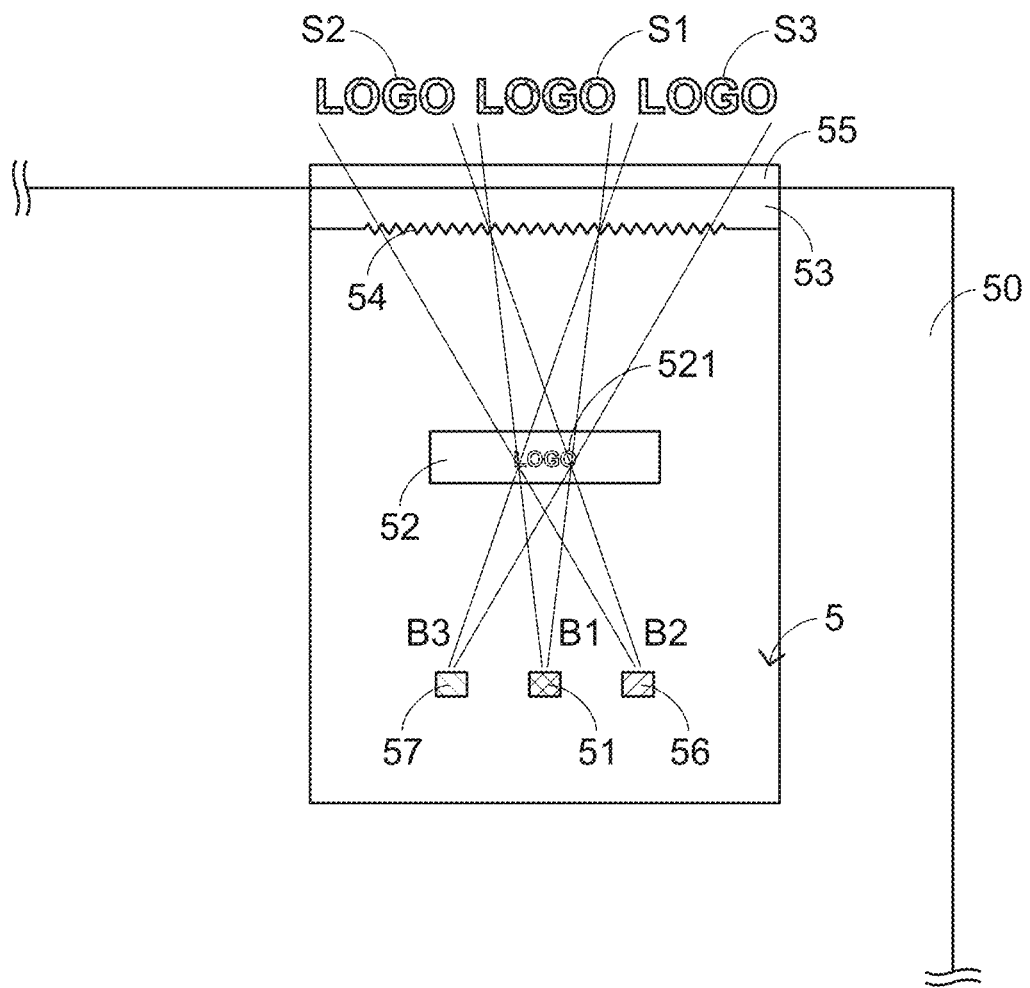
FIG. 7 is a schematic side view illustrating the structure of a display device according to a fourth embodiment of the present invention.

The present invention further provides a fourth embodiment. FIG. 7 is a schematic side view illustrating the structure of a display device according to a fourth embodiment of the present invention. The display device 5 is disposed within a casing 50 of an electronic device. In this embodiment, the display device 5 comprises a first light source 51, a projection part 52, a display part 53, an imaging structure 54, a protective layer 55, a driving circuit module (not shown), a second light source 56 and a third light source 57. The projection part 52 has an image region 521. The structures of the components of the display device 5 which are identical to those of the first embodiment are not redundantly described herein. In comparison with the first embodiment, the display device 5 of this embodiment is additionally equipped with the second light source 56 and the third light source 57.

When the first light source 51 is enabled by the driving circuit module, the first light source 51 emits a first light beam B1. The first light beam B1 is projected to the projection part 52. After the first light beam B1 passes through the image region 521 of the projection part 52, the image region 521 can be projected on a first position of the display part 53 because of the arrangement of the imaging structure 54. That is, a first projection pattern S1 corresponding to the image region 521 is shown on the first position of the display part 53. The first projection pattern S1 has the color of the first light beam B1. In an embodiment, the first light source 51 is a green light emitting diode. Consequently, the first projection pattern S1 with the green color is shown on the first position of the display part 53.

When the second light source 56 is enabled by the driving circuit module, the second light source 56 emits a second light beam B2. The second light beam B2 is projected to the projection part 52. After the second light beam B2 passes through the image region 521 of the projection part 52, the image region 521 can be projected on a second position of the display part 53 because of the arrangement of the imaging structure 54. That is, a second projection pattern S2 corresponding to the image region 521 is shown on the second position of the display part 53. The second projection pattern S2 has the color of the second light beam B2. In an embodiment, the second light source 56 is a red light emitting diode. Consequently, the second projection pattern S2 with the red color is shown on the second position of the display part 53.

When the third light source 57 is enabled by the driving circuit module, the third light source 57 emits a third light beam B3. The third light beam B3 is projected to the projection part 52. After the third light beam B3 passes through the image region 521 of the projection part 52, the image region 521 can be projected on a third position of the display part 53 because of the arrangement of the imaging structure 54. That is, a third projection pattern S3 corresponding to the image region 521 is shown on the third position of the display part 53. The third projection pattern S3 has the color of the third light beam B3. In an embodiment, the third light source 57 is a blue light emitting diode. Consequently, the third projection pattern S3 with the blue color is shown on the second position of the display part 53.

Figure 8:
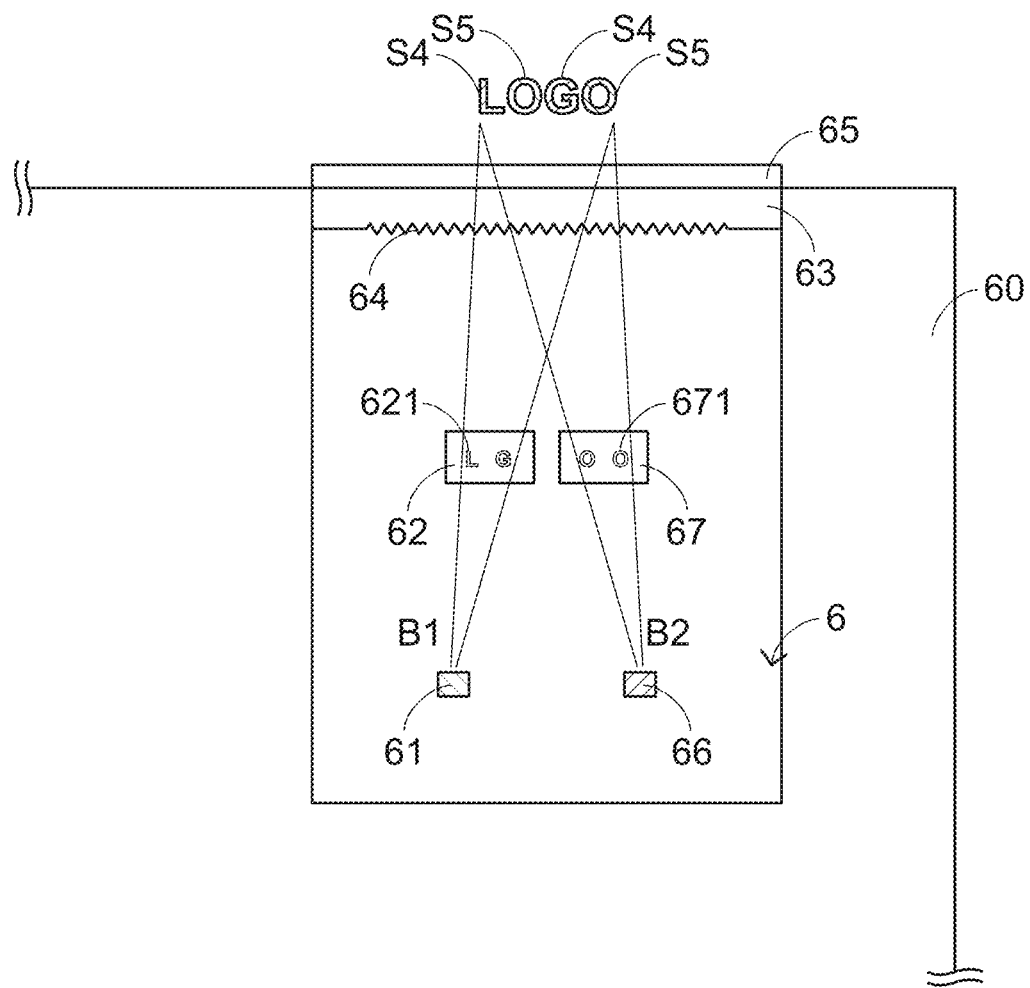
FIG. 8 is a schematic side view illustrating the structure of a display device according to a fifth embodiment of the present invention.

The present invention further provides a fifth embodiment. FIG. 8 is a schematic side view illustrating the structure of a display device according to a fifth embodiment of the present invention. The display device 6 is disposed within a casing 60 of an electronic device. In this embodiment, the display device 6 comprises a first light source 61, a first projection part 62, a display part 63, an imaging structure 64, a protective layer 65, a driving circuit module (not shown), a second light source 66 and a second projection part 67. The first projection part 62 has a first image region 621. The second projection part 67 has a second image region 671. The structures of the components of the display device 6 which are identical to those of the first embodiment are not redundantly described herein. In comparison with the first embodiment, the display device 6 of this embodiment is additionally equipped with the second light source 66 and the second projection part 67. The second projection part 67 is located beside the first projection part 62. The second image region 671 is different from the first image region 621. In an embodiment, the first light source 61 is a green light emitting diode, and the second light source 66 is a red light emitting diode.

When the first light source 61 is enabled by the driving circuit module, the first light sources 61 emit a first light beam B1. The first light beam B1 is projected to the first projection part 62. After the first light beam B1 passes through the first image region 621 of the first projection part 62, the first image region 621 can be projected on the display part 63 because of the arrangement of the imaging structure 64. That is, a first projection pattern corresponding to the first image region 621 is shown on the first display part 63. The first projection pattern has the color of the first light beam B1. Consequently, the first projection pattern with the green color is shown on the display part 63.

When the second light source 66 is enabled by the driving circuit module, the second light source 66 emits a second light beam B2. The second light beam B2 is projected to the second projection part 67. After the second light beam B2 passes through the second image region 671 of the second projection part 67, the second image region 671 can be projected on the display part 63 because of the arrangement of the imaging structure 64. That is, a second projection pattern corresponding to the second image region 671 is shown on the display part 63. The second projection pattern has the color of the second light beam B2. Consequently, the second projection pattern with the red color is shown on the display part 63.

Then, the first projection pattern and the second projection pattern are combined as a complete projection pattern. The complete projection pattern is shown in FIG. 8.

It is noted that the display device is selectively equipped with the protective layer according to the practical requirements. That is, the protective layer is not the essential component of the display device.

From the above descriptions, the display device of the present invention comprises the projection part, the imaging structure, the display part and the protective layer. The projection part has the image region. Due to the arrangement of the imaging structure, the image region is projected to the display part. Alternatively, the image region is projected to the display part through the ink structure. Consequently, the user can view the complete and non-distorted image region at any viewing angle. Moreover, due to the opaque portion of the projection part, the imaging structure or the protective layer, the light source within the casing is hindered by these components and the light source is not visible from the outside. In some embodiments, the light source is a dot light source. Due to the projection part with the image region or the ink structure, the projection pattern can be projected to the non-flat display part, for example the display part with a curvy surface. Consequently, the display device of the present invention can overcome the drawbacks of the conventional technologies.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A device for showing a projection pattern disposed within a casing of an electronic device, the device comprising:
    a display part disposed on the casing and exposed outside;
    at least one light source disposed within the casing, and emitting at least one light beam;
    a projection part arranged between the at least one light source and the display part, and having an image region, wherein after the at least one light beam passes through the projection part, a projection pattern corresponding to the image region is generated, and the projection part is a photographic film; and
    an imaging structure disposed on an inner surface of the display part facing the projection part or within the display part, wherein the imaging structure and the projection part are separated only by a space, and the imaging structure receives the projection pattern, so that the projection pattern is shown on the display part, wherein the imaging structure is formed by an optical machining process, and the optical machining process is a sandblasting process, a printing process, a texturing process, a dying process or a coating process.

2. The device according to claim 1, wherein the device further comprises a protective layer, wherein the protective layer covers the display part to protect the display part.

3. The device according to claim 1, wherein the device further comprises an ink structure, which is disposed on an outer surface of the display part, wherein the ink structure receives the projection pattern, so that the projection pattern is shown on the display part.

4. The device according to claim 3, wherein the ink structure is made of invisible photoluminescence ink, and each of the at least light source is an invisible light emitting diode.

5. The device according to claim 3, wherein the device further comprises a protective layer, which is disposed on an outer surface of the ink structure, wherein the protective layer covers the ink structure to protect the ink structure.

6. The device according to claim 3, wherein the ink structure is in contact with the outer surface of the display part.

7. The device according to claim 1, wherein the imaging structure comprises phosphor agent or light diffusion agent.

8. A device for showing a projection pattern disposed within a casing of an electronic device, the device comprising:
    a display part disposed on the casing and exposed outside;
    a first light source disposed within the casing, and emitting a first light beam;
    a second light source disposed within the casing, and emitting a second light beam;
    a first projection part arranged between the first light source and the display part, and having a first image region, wherein after the first light beam passes through the first projection part, a first projection pattern corresponding to the first image region is generated, and the first projection part is a photographic film;
    a second projection part arranged between the second light source and the display part, and having a second image region, wherein after the second light beam passes through the second projection part, a second projection pattern corresponding to the second image region is generated, and the second projection part is another photographic film; and
    an imaging structure disposed on an inner surface of the display part facing the first and second projection parts or within the display part, wherein the imaging structure and the first and second projection parts are separated only by a space, and the imaging structure receives the first projection pattern and the second projection pattern, so that a complete projection pattern containing the first projection pattern and the second projection pattern is shown on the display part, wherein the imaging structure is formed by an optical machining process, and the optical machining process is a sandblasting process, a printing process, a texturing process, a dying process or a coating process.

9. The device according to claim 8, wherein the first light source is a first color light emitting diode emitting the first light beam with a first color, the second light source is a second color light emitting diode emitting the second light beam with a second color, and the complete projection pattern contains the first color and the second color.

10. The device according to claim 8, wherein the imaging structure comprises phosphor agent or light diffusion agent.

* * * * *